United States Patent Office 3,451,965

Patented June 24, 1969

3,451,965

ONE-PACKAGE ROOM TEMPERATURE CURABLE POLYSILOXANE COMPOSITIONS

Frederick M. Lewis, Burnt Hills, N.Y., assignor to General Electric Company, a corporation of New York No Drawing. Filed Dec. 26, 1967, Ser. No. 693,157

Int. Cl. C08g 51/74, 47/04

U.S. Cl. 260—46.5 4 Claims

ABSTRACT OF THE DISCLOSURE

Polysiloxanes containing silanic hydrogen and a platinum or platinum compound catalyst are cured in the presence of atmospheric moisture. The compositions are made by mixing a polysiloxane containing silanic hydrogen with a platinum or platinum compound catalyst. The compositions are storable in the absence of moisture and are cured by exposure to atmospheric moisture. The compositions of the present invention are useful as potting compounds for high frequency, capacitance tuned circuits.

This invention relates to a one-package polysiloxane composition which is stable for prolonged periods of time in a sealed container but curable upon exposure to atmospheric moisture. Previous one-package room temperature, moisture curable polysiloxane compositions have been based upon the presence of radicals on the polysiloxane which hydrolyze to cause cross-linking when exposed to atmospheric moisture. The hydrolysis, however, forms volatile acids, bases, conductive materials or polar compounds having a high dielectric constant. Potting compounds containing volatile acids, bases, conductive materials and polar compounds cannot be used in high frequency electronic circuits or as insulators on high frequency conductors when a high degree of frequency stability is required. The reason being that the volatilization of the compounds changes the dielectric constant or the conductivity of the area surrounding the tuning circuit resulting in frequency changes.

I have discovered that polysiloxanes containing silanic hydrogen, when mixed with a platinum or platinum compound catalyst, cure in the presence of moisture and liberate only hydrogen. The hydrogen diffuses from the cured polysiloxane leaving no residue. In addition, when a high frequency circuit is covered with a curable composition within the scope of the present invention and the composition is cured, the circuit is protected from humidity changes. Unlike the usual potting compounds, the insulating properties are not adversely affected in regions of high humidity, but remain essentially constant regardless of humidity conditions. This is accomplished by providing excess silanic hydrogen in the potting composition over that required to cure the composition. The excess silanic hydrogen continues to react and remove from the environs of the circuit any atmospheric moisture which enters the circuit enclosure throughout the life of the electronic circuit.

In capacitance tuned high frequency communications equipment, frequency stability is a problem. This is primarily due to the fact that very small changes in capacitance cause very large changes in frequency. Two of the primary causes of small changes in capacitance of capacitance tuned communications equipment are vibration and humidity variation. There is also some change due to the circuit board picking up moisture and becoming very slightly conductive.

The present invention eliminates the problem of frequency instability by providing a potting compound which moisture cures very slowly during its use, thus providing both structural stability and constant humidity in the environs of the electric circuit used in high frequency communications equipment.

Constant humidity control in the environs of the high frequency circuit is maintained by providing an excess of silanic hydrogen in the potting compound which reacts with any water which enters the circuit enclosure to form Si-O-Si cross links in the potting composition with the evolution of hydrogen gas. By this means, the dielectric constant of the potting compound which separates the electronic components remains essentially constant even though the circuit is used in areas of wide humidity variation. As the circuit invariably is in an enclosure which provides only limited amounts of air to enter the circuit compartment, the humidity of the circuit compartment is also maintained at a constant low level due to moisture pick-up by the potting compound. The compartment humidity control prevents capacitance changes due to high humidity conditions around power supply leads and antenna leads.

While the compositions of the present invention are primarily useful in high frequency circuit application, such as transmitters and receivers, they are also useful as potting compounds in other circuit applications where changes in dielectric constant and the presence of moisture presents problems. Such applications include their use as potting compounds in precision test equipment used in research laboratories.

The compositions of the present invention are also useful in caulking and sealing applications and as an adhesive for paint, fabric, plastic, glass, wood, tape, paper, and metal bases which may be damaged or discolored by the hydrolysis products given off in the hydrolysis of the prior art one-package adhesives.

The moisture curable polysiloxanes of the present invention have the average unit formula:

$$(R)_a(H)_bSiO_{\frac{4-a-b}{2}} \qquad (1)$$

where R is selected from the class consisting of alkyl radicals, e.g., methyl, ethyl, propyl, isopropyl, butyl, octyl, etc.; cycloalkyl radicals, e.g., cyclopentyl, cyclohexyl, cycloheptyl, etc.; aryl radicals, e.g., phenyl, naphthyl, tolyl, xylyl, etc.; aralkyl radicals, e.g., benzyl, phenylethyl, phenylpropyl, etc., halogenated derivatives of the above radicals including chloromethyl, chloropropyl, trifluoromethyl, chlorophenyl, dibromophenyl, tetrachlorophenyl, difluorophenyl, etc. radicals, and cyanoalkyl radicals, e.g., beta-cyanoethyl, gamma-cyanopropyl, beta-cyanopropyl, delta-cyanobutyl, etc., $a$ has a value of 1.02 to 1.998, $b$ has a value of 0.002 to 1.0, and the sum of $a$ plus $b$ has a value of 2.0002 to 2.2.

The silanic hydrogen-containing polysiloxanes of Formula 1 are subject to the further limitation that they contain not more than one silanic hydrogen atom on any one silicon atom. When the curable polysiloxane compositions contain silicon atoms substituted by two or more silanic hydrogen atoms, the cure rates are too fast to provide long term moisture control and a gassing problem sometimes occurs when deep section potting applications are attempted. The gassing causes bubble formation which adversely affects the dielectric and optical properties of the potting compound.

The moisture curable compositions of the present invention are prepared by merely mixing a silanic hydrogen-containing polysiloxane as defined by Formula 1 with a platinum or platinum compound catalyst in the absence of moisture. A filler, free of hydroxyl, silanol and other groups which are reactive with silanic hydrogen, can optionally be present.

The polysiloxanes which are used in the practice of the present invention are known in the art. These polysiloxanes can be obtained by hydrolyzing a monoorgano hydrolyzable silane, for example, methyldichlorosilane, with optionally a diorganodihydrolyzable silane, such as dimethyldichlorosilane, and with small amounts of a triorganomonohydrolyzable silane, for example, trimethylchlorosilane or a small amount of a diorganomonohydrolyzable silane, for example, dimethylchlorosilane, etc., and thereafter effecting condensation of the hydrolysis product using a condensing agent, for instance an acidic condensing agent, such as ferric chloride, calcium acid sulfate, etc. Alternately, cyclic dimethylsiloxanes and cyclic organosiloxanes containing silanic hydrogen can be rearranged with an acid catalyst, preferably sulfuric acid or an acid clay, to give the desired polysiloxane which is curable in the presence of moisture.

For practical purposes, when the polysiloxane used in the practice of the present invention is a watery fluid, the ratio of silanic hydrogen to siloxy units has a high value so that the fluid will harden fast. Thus, the manufacturing time required to produce a potted communications circuit is lessened. As the viscosity of the polysiloxane increases, the ratio of silanic hydrogen to siloxy units can be decreased. When the viscosity of the polysiloxane reaches $10\times10^6$ centistokes or more, sufficient structural rigidity is provided to allow shipment and operation of a potted communications circuit without a cure stage. For example, when the sum of $a$ plus $b$ of Formula 1 has a value of 2.02 to 2.2 and the polysiloxane is a watery fluid, $b$ has a value of 0.1 to 0.5. When the sum of $a$ plus $b$ has a value of 2.0003 to 2.0007, the fluid polysiloxane is a gum and $b$ has a value of 0.002 to 0.004.

The cure rate of the compositions of the present invention can be increased by increasing the ratio of silanic hydrogen to silicon and/or increasing the amount of atmospheric moisture present.

The platinum or platinum compound catalysts which can be employed include any of the plantinum metal or platinum compound catalysts generally utilized in SiH-olefin addition reactions.

Among the many useful catalysts for this reaction are finely divided platinum as described in Patent 2,970,150, Bailey, chloroplatinic acid as described in Patent 2,823,218, Speier et al., the reaction product of chloroplatinic acid with either an alcohol, an ether, or an aldehyde as described in Patent 3,220,972, Lamoreaux, trimethylplatinum iodide and hexamethyldiplatinum as described in Patent 3,313,773, Lamoreaux, the platinum-olefin complex catalysts as described in Patent 3,159,601, Ashby, and the platinum-cyclopropane complex catalyst as described in Patent 3,159,662, Ashby. In general, amounts of from 0.01 to 250 parts per million by weight of platinum based on the total weight of curable composition present, can be used. Preferably, the amount is from 0.01 to 10 p.p.m. as platinum based on the total weight of the polysiloxane. The catalyst can be employed in amounts greater than 250 parts per million by weight of platinum, but due to the cost of the materials, utilization of greater than 250 parts per million is not preferred.

The order of addition of the silanic hydrogen-containing polysiloxane, the catalyst and, optionally, the filler, is immaterial. All can be added simultaneously or the filler and catalyst can be added at various times to the silanic hydrogen-containing polysiloxane and a homogeneous blend obtained. Following blending of the various materials, the composition formed may be stored in a sealed container until it is desired that a cure be effected. Refrigeration can be employed to increase the storage time. Storage times vary from 2 months for compositions containing the maximum concentration of one silanic hydrogen per siloxy unit and a high catalyst concentration to at least a year and probably indefinitely for compositions containing a low catalyst level and a low ratio of silanic hydrogen to siloxy units.

In order that those skilled in the art might readily understand how to practice the present invention, the following examples are presented. The catalyst used in the examples was a platinum coordinate catalyst as described in Patent 3,220,972, Lamoreaux. The catalyst was prepared by dissolving chloroplatinic acid in 2-ethylhexyl alcohol in the ratio of one mole of chloroplatinic acid hexahydrate to 7 moles of 2-ethylhexyl alcohol. The pressure of the resulting mixture was reduced to 25 mm. and the reaction mixture was heated for 4 hours at 70° C. during which time hydrogen chloride and water were removed from the system. The pressure was then further reduced to 2 mm. Hg and the heating was continued until all unreacted alcohol had been removed. The reaction mixture was then allowed to cool to room temperature and was filtered. The filtrate was a viscous, pale brown liquid. This catalyst contained 21% by weight platinum and 8.3% by weight chlorine, which corresponds to about 2.1 atoms of chlorine per atom of platinum. The catalyst was dissolved in toluene to produce a solution containing 35 p.p.m. of platinum as metal based upon the weight of the solution. The 35 p.p.m. catalyst solution is hereinafter referred to as the platinum coordinate catalyst solution.

EXAMPLE 1

To 100 parts of a trimethylsilyl end-stopped methylhydrogenpolysiloxane of the average unit formula:

$$(CH_3)_{1.08}(H)_{.96}SiO_{.98}$$

sufficient platinum coordinate catalyst solution was added to provide 0.1 p.p.m. by weight of platinum as metal based upon the weight of the polysiloxane. A curable composition was produced. A small 100 megacycle, capacitance tuned oscillator circuit was covered to a depth of ¼ inch with the curable composition. After 4 hours, the curable composition had turned to a rubbery gel. After one day, the gel had turned into a hard resin. Over the period of one hour, the relative humidity of the atmosphere surrounding the oscillator was gradually increased from 0% to 100%. There was no detectable change in oscillator frequency.

The remainder of the catalyzed curable composition was stored in a sealed bottle for one month. The appearance of the fluid did not change during the period. After the one month storage period, a second electronic circuit was covered with the catalyzed curable composition and the composition cured in the same manner as it did one month earlier.

EXAMPLE 2

A composition was formulated containing 100 parts of a gum having the average unit formula:

$$(C_6H_5)_{0.181}(CH_3)_{1.817}(H)_{0.0023}SiO_{0.99987}$$

and sufficient platinum coordinate catalyst solution to provide 0.1 p.p.m. by weight of platinum as metal based upon the total weight of the polysiloxane. The composition was used to cover a capacitance tuned 100 megacycle oscillator circuit to a depth of ¼ inch. The coated circuit was exposed to the atmosphere for one week to cure the gum. The oscillator circuit was subjected to a 100% relative humidity change over a one hour period with no measurable frequency variation.

EXAMPLE 3

To 100 parts of a polysiloxane having the average unit formula:

$$(CH_3)_{1.91}(H)_{0.0905}SiO_{0.9998}$$

was added sufficient platinum coordinate catalyst solution to provide 0.2 p.p.m. by weight of platinum as metal based upon the weight of the polysiloxane. A stainless steel pan was filled to a depth of ⅛ inch with the catalyzed polysiloxane. Over a period of 7 days, the polysiloxane cured to an elastomeric resin.

EXAMPLE 4

To 100 parts of a trimethylsilyl end-stopped polysiloxane of the average unit formula:

$$(CH_3)_{1.81}(H)_{.238}SiO_{.976}$$

was added sufficient platinum coordinate catalyst solution to provide 1.0 p.p.m. by weight of platinum as metal based upon the weight of the polysiloxane. A stainless steel pan 6 inches square was filled to a depth of ⅛ inch with the catalyzed polysiloxane. After 15 hours of exposure to the atmosphere, the catalyzed polysiloxane cured to a rubbery gel.

What I claim as new and desire to secure by Letters Patent of the United States is:

1. A composition of matter stable under anhydrous conditions and curable to the solid state in the presence of atmospheric moisture consisting of (1) a polysiloxane of the average unit formula:

$$(R)_a(H)_bSiO_{\frac{4-a-b}{2}}$$

where R is selected from the class consisting of alkyl radicals, cycloalkyl radicals, aryl radicals, aralkyl radicals, halogenated derivatives of the above organic radicals and cyanoalkyl radicals, $a$ has a value of 1.02 to 1.998, $b$ has a value of 0.002 to 1.0, and the sum of a plus $b$ has a value of 2.0002 to 2.2, and subject to the further limitation that the polysiloxane contains not more than one silanic hydrogen atom on any one silicon atom, and (2) a platinum-containing catalyst of the type generally utilized in SiH-olefin addition reactions in an amount from 0.01 p.p.m. to 250 p.p.m. by weight of platinum as metal based on the total weight of the polysiloxane.

2. The composition of claim 1 wherein the platinum-containing catalyst is present in a range sufficient to provide from 0.01 to 10 p.p.m. of platinum by weight based upon the total weight of the polysiloxane.

3. A composition within the scope of claim 1, wherein $b$ has a value of 0.1 to 0.5, and the sum of $a$ plus $b$ has a value of 2.02 to 2.2.

4. A composition within the scope of claim 1, wherein $b$ has a value of 0.002 to 0.004, and the sum of $a$ plus $b$ has a value of 2.0003 to 2.0007.

References Cited

UNITED STATES PATENTS 2,967,170 1/1961 Merker ------------ 260—46.5
3,328,448 6/1967 Barnes et al. ------- 260—448.2

DONALD E. CZAJA, *Primary Examiner.*

M. I. MARQUIS, *Assistant Examiner.*

U.S. Cl. X.R.

117—135.1, 161; 260—37, 448.2